(12) United States Patent
Irmer et al.

(10) Patent No.: US 8,779,777 B2
(45) Date of Patent: Jul. 15, 2014

(54) DYNAMIC COMPENSATION OF AGING DRIFT IN CURRENT SENSE RESISTOR

(75) Inventors: Frank Irmer, Munich (DE); Bernhard Engl, Stephanskirchen (DE)

(73) Assignee: Linear Technology Corporation, Milpitas, CA (US)

( * ) Notice: Subject to any disclaimer, the term of this patent is extended or adjusted under 35 U.S.C. 154(b) by 652 days.

(21) Appl. No.: 13/111,636

(22) Filed: May 19, 2011

(65) Prior Publication Data

US 2011/0298473 A1  Dec. 8, 2011

Related U.S. Application Data

(60) Provisional application No. 61/351,600, filed on Jun. 4, 2010.

(51) Int. Cl.
*G01R 35/00* (2006.01)
*G01R 27/02* (2006.01)
*G01R 1/02* (2006.01)

(52) U.S. Cl.
CPC .............. *G01R 35/00* (2013.01); *G01R 27/02* (2013.01); *G01R 1/02* (2013.01); *G01R 35/005* (2013.01)
USPC ............................ 324/601; 324/619; 324/130

(58) Field of Classification Search
CPC .......... G01R 35/00; G01R 27/02; G01R 1/02; G01R 35/005
USPC .......................................... 324/601, 619, 130
See application file for complete search history.

(56) References Cited

U.S. PATENT DOCUMENTS

| 788,894 | A | * | 5/1905 | Evans | 248/230.5 |
| 3,560,880 | A | * | 2/1971 | Easton et al. | 331/158 |
| 3,562,673 | A | * | 2/1971 | Carpari | 332/183 |
| 4,774,492 | A | * | 9/1988 | Shier | 338/309 |

(Continued)

FOREIGN PATENT DOCUMENTS

| CN | 1378086 A | 11/2002 |
| EP | 1607753 A1 | 12/2005 |

(Continued)

OTHER PUBLICATIONS

Office Action, dated Jun. 20, 2013, for corresponding Chinese Patent Application No. 201110148969.X, filed Jun. 3, 2011, entitled "Dynamic Compensation of Aging Drift in Current Sense Resistor," Frank Irmer et al., inventors.

(Continued)

*Primary Examiner* — Patrick Assouad
*Assistant Examiner* — Lamarr Brown
(74) *Attorney, Agent, or Firm* — McDermott Will & Emery LLP

(57) ABSTRACT

A current sense resistor circuit may include a primary current sense resistor that drifts with age. A secondary current sense resistor may drift with age in substantial unison with the primary current sense resistor. A calibration resistor may not drift with age in substantial unison with the primary current sense resistor. A compensation circuit may compensate for aging drift in the resistance of the primary current sense resistor based on a comparison of the calibration resistor with the secondary current sense resistor. The secondary current sense resistor may be in parallel with the primary current sense resistor, except when the compensation circuit is comparing the calibration resistor with the secondary current sense resistor.

22 Claims, 8 Drawing Sheets

(56) References Cited

U.S. PATENT DOCUMENTS

| | | | | |
|---|---|---|---|---|
| 5,060,131 | A | * | 10/1991 | Sikora .............................. 363/97 |
| 5,079,957 | A | * | 1/1992 | Wehrs ........................ 73/861.17 |
| 5,172,039 | A | * | 12/1992 | Owens .......................... 318/489 |
| 5,268,651 | A | * | 12/1993 | Kerth ............................ 330/307 |
| 5,319,370 | A | * | 6/1994 | Signore et al. ................. 341/120 |
| 5,702,431 | A | * | 12/1997 | Wang et al. ..................... 607/61 |
| 5,721,688 | A | * | 2/1998 | Bramwell ....................... 702/63 |
| 5,789,934 | A | * | 8/1998 | Kolkowski et al. ...... 324/764.01 |
| 6,342,997 | B1 | | 1/2002 | Khadkikar et al. |
| 6,429,641 | B1 | * | 8/2002 | Montrose ................. 324/123 C |
| 6,531,862 | B1 | * | 3/2003 | Stanley ......................... 324/127 |
| 6,629,638 | B1 | * | 10/2003 | Sanchez ........................ 235/454 |
| 6,943,518 | B1 | * | 9/2005 | Mooney ........................ 318/490 |
| 7,116,113 | B1 | | 10/2006 | Thompsen et al. |
| 7,256,371 | B2 | | 8/2007 | Crawford et al. |
| 7,349,454 | B2 | * | 3/2008 | Quek et al. ................. 372/38.02 |
| 7,558,093 | B1 | * | 7/2009 | Zheng ............................ 363/97 |
| 7,643,322 | B1 | * | 1/2010 | Varga et al. ..................... 363/97 |
| 7,787,262 | B2 | * | 8/2010 | Mangtani et al. ............... 363/18 |
| 7,888,944 | B2 | * | 2/2011 | Niroomand ................... 324/428 |
| 7,973,543 | B2 | * | 7/2011 | Andoh et al. ................. 324/713 |
| 8,013,580 | B2 | * | 9/2011 | Cervera et al. ................ 323/268 |
| 8,102,629 | B2 | * | 1/2012 | Harris et al. .................... 361/42 |
| 8,289,037 | B2 | * | 10/2012 | Labib et al. ................... 324/713 |
| 8,421,416 | B2 | * | 4/2013 | Hsu et al. ...................... 320/134 |
| 8,476,909 | B2 | * | 7/2013 | Chang et al. .................. 324/601 |
| 2002/0171454 | A1 | * | 11/2002 | Yakabe et al. .................. 327/77 |
| 2002/0180418 | A1 | * | 12/2002 | Jones et al. ................... 324/118 |
| 2005/0205549 | A1 | * | 9/2005 | Crawford et al. ............. 219/494 |
| 2006/0132230 | A1 | | 6/2006 | Douglas |
| 2006/0192571 | A1 | * | 8/2006 | Banaska et al. ............... 324/713 |
| 2007/0046281 | A1 | * | 3/2007 | Domingo et al. ............. 324/142 |
| 2007/0071046 | A1 | * | 3/2007 | Quek et al. ................. 372/38.02 |
| 2007/0170932 | A1 | * | 7/2007 | Verheijen ...................... 324/705 |
| 2007/0194736 | A1 | * | 8/2007 | Pino et al. ..................... 318/446 |
| 2007/0247141 | A1 | | 10/2007 | Pastre et al. |
| 2007/0296387 | A1 | * | 12/2007 | Dong et al. ................... 323/285 |
| 2007/0296391 | A1 | * | 12/2007 | Bertin et al. .................. 323/303 |
| 2008/0068193 | A1 | * | 3/2008 | Balakrishnan et al. ........ 340/664 |
| 2008/0203985 | A1 | * | 8/2008 | Dong et al. ................... 323/272 |
| 2009/0015184 | A1 | * | 1/2009 | Knierim ........................ 318/490 |
| 2010/0054001 | A1 | * | 3/2010 | Dyer et al. ................. 363/21.17 |
| 2010/0124084 | A1 | * | 5/2010 | Chang et al. ................... 363/95 |
| 2011/0025299 | A1 | * | 2/2011 | Vulovic et al. ................ 324/115 |
| 2011/0057707 | A1 | * | 3/2011 | Bronczyk et al. ............. 327/332 |
| 2011/0068819 | A1 | * | 3/2011 | Sims et al. ............... 324/764.01 |
| 2011/0215823 | A1 | * | 9/2011 | Solki ............................. 324/705 |
| 2011/0221424 | A1 | * | 9/2011 | McNamara ................... 324/126 |
| 2011/0291675 | A1 | * | 12/2011 | Rallabandi et al. ........... 324/679 |
| 2011/0316501 | A1 | * | 12/2011 | Cervera et al. ................ 323/268 |
| 2012/0001649 | A1 | * | 1/2012 | Porter et al. .................. 324/721 |

FOREIGN PATENT DOCUMENTS

| | | |
|---|---|---|
| TW | 531647 A | 5/2003 |
| TW | M286370 B | 1/2006 |
| TW | 200744293 A | 12/2007 |

OTHER PUBLICATIONS

Office Action, Dec. 3, 2013, for corresponding Taiwanese Patent Application No. 100119424, filed Jun. 2, 2011, entitled "Dynamic Compensation of Aging Drift in Current Sense Resistor," Frank Irmer et al., inventors. (Translation Only).

* cited by examiner

DYNAMIC COMPENSATION OF AGING DRIFT IN CURRENT SENSE RESISTOR

CROSS-REFERENCE TO RELATED APPLICATION

This application is based upon and claims priority to U.S. provisional patent application 61/351,600, entitled "DYNAMIC MEASUREMENT AND COMPENSATION OF AGING DRIFTS OF CURRENT SENSE RESISTORS," filed Jun. 4, 2010, the entire content of which is incorporated herein by reference.

BACKGROUND

1. Technical Field

This disclosure relates to compensation of aging drift in a current sense resistor.

2. Description of Related Art

A precision resistor can be used to measure current and in other applications. However, its resistance and temperature sensitivity can drift with age—up to several percent during the first years of life. This may be caused, for example, by wear on the resistor that takes place when current is passed through it, particularly large current.

Compensation for this aging drift may be needed to insure that measurements made with the resistor continue to be accurate. The change in its resistance may be measured and used as the basis for providing this compensation.

An external calibration resistor is sometimes used to assist in the measurement of this change in resistance. The precision resistor is removed from the circuit, its resistance is compared to the external calibration resistor, and compensation is provided based on any measured difference.

This calibration process, however, can interrupt normal circuit operation. It can also require an external calibration resistor to be stored and located.

SUMMARY

A current sense resistor circuit may include a primary current sense resistor that drifts with age. A secondary current sense resistor may drift with age in substantial unison with the primary current sense resistor. A calibration resistor may not drift with age in substantial unison with the primary current sense resistor. A compensation circuit may compensate for aging drift in the resistance of the primary current sense resistor based on a comparison of the calibration resistor with the secondary current sense resistor. The secondary current sense resistor may be in parallel with the primary current sense resistor, except when the compensation circuit is comparing the calibration resistor with the secondary current sense resistor.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
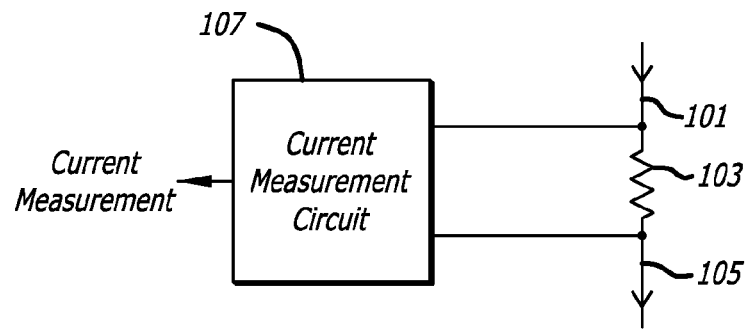
FIG. 1 illustrates an example of a prior art current sense resistor circuit.

FIG. 1 illustrates an example of a prior art current sense resistor circuit.

As illustrated in FIG. 1, current may pass from a node 101 through a precision resistor 103 to a node 105. The word "resistor" as used herein is intended to mean a single resistor or a combination of resistors. The voltage which is developed across the resistor 103 may be measured by a current measurement circuit 107, such as a voltmeter. The current which travels through the resistor 103 may then be calculated based on Ohms law, namely by dividing the measured voltage by the resistance of the resistor 103.

The accuracy of this current measurement may be dependent upon the stability of the resistor 103. As indicated above, however, the resistance of the resistor 103, as well as its temperature sensitivity, may drift as a function of age. A significant contributing cause of the drift may be current which travels through the resistor 103, which in some applications may be substantial (e.g., several amps).

To correct for this drift, the resistor 103 may be removed from the circuit and compared to a calibration resistor which has not been subject to the same prolonged and possibly high currents. The difference which results from the comparison may be used to determine needed compensation.

Figure 2:
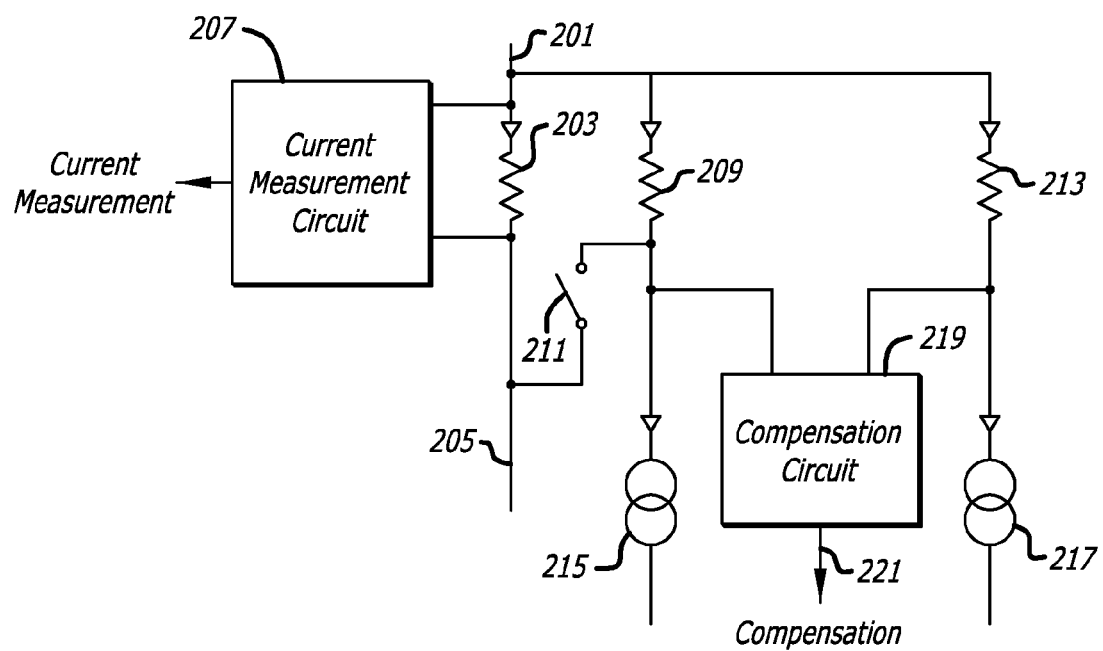
FIG. 2 illustrates an example of a current sense resistor circuit that dynamically compensates for aging drift in a primary current sense resistor, without the need to interrupt circuit operation or utilize an external calibration resistor.

FIG. 2 illustrates an example of a current sense resistor circuit that dynamically compensates for aging drift in a primary current sense resistor, without the need to interrupt circuit operation or utilize an external calibration resistor.

As illustrated in FIG. 2, current may similarly travel from a node 201 through a primary current sense resistor 203 to a node 205. A current measurement circuit 207 may similarly measure the current which travels through the primary current sense resistor 203 by measuring the voltage across it and computing the current based on Ohms law.

During normal operation of this circuit, a secondary current sense resistor 209 may be connected in parallel across the primary current sense resistor 203 by the closure of a switch 211. During this normal mode of operation, the remaining components which are illustrated in FIG. 2 may not be connected across the nodes 201 and 205. Alternatively, current sources 215 and 217 may be switched off and compensation circuit 219 may not draw any significant current at its inputs. Thus, during this normal mode of operation, current from the node 201 may travel to the node 205 only through the primary current sense resistor 203 and the secondary current sense resistor 209 through the then closed switch 211.

The secondary current sense resistor 209 may be configured to drift with age in substantial unison with the primary current sense resistor 203. To accomplish this, for example, the secondary current sense resistor 209 may be configured to have the same current density as the primary current sense resistor 203, i.e., to conduct the same amount of current across the same cross-sectional area of the resistive material as the primary current sense resistor 203. The two resistors may be positioned near one another on a common substrate, thus ensuring that they experience the same environment, such as the same temperature. They may be made of the same or different material. In case of a different material, it may have similar drift characteristics for the compensation to work, or have a different drift characteristic that has a known relation to the drift characteristic of the primary current sense resistor.

The secondary current sense resistor 209 may be much larger in resistivity than the primary current sense resistor 203, such as between 10 and 1,000 times its resistance or between 1 and 1,000,000.

Aging drift in the primary current sense resistor 203 may be tested and compensated for by the remaining components illustrated in FIG. 2 during a testing and compensation mode of operation. This testing and compensation may be performed on an ad hoc basis, periodically, and/or in accordance with any other criteria. The circuit illustrated in FIG. 2 may be configured to automatically perform this testing and compensation, upon manual request, or both.

During the testing and compensation mode, switch 211 may be opened and the remaining components in the circuit may be connected as illustrated in FIG. 2. Prior to this testing and compensation mode, on the other hand, appropriate switches may be provided (not shown) which ensure that the remaining components in FIG. 2 are not connected between the nodes 201 and 205.

The remaining circuitry may include a calibration resistor 213. The calibration resistor 213 may be configured not to drift with age in substantial unison with the primary current sense resistor 203. For example, the calibration resistor 213 may be configured not to have any current pass through it during the normal operation of the circuit in FIG. 2. It may or may not be isolated from the environment of the primary current sense resistor 203, such as from temperature changes caused by the passage of current through the primary current sense resistor 203.

The calibration resistor 213 may be configured to have a resistance which is substantially the same as the secondary current sense resistor 209 when the circuit is first constructed.

During the testing and compensation mode, a constant current source 215 and a constant current source 217 may be configured to deliver a constant current through the secondary current sense resistor and the calibration resistor 213, respectively. These constant currents may be equal.

The voltages that are developed across the secondary current sense resistor 209 and the calibration resistor 213 may be delivered to a compensation circuit 219. The compensation circuit 219 may be configured to compensate for aging drift in the resistance of the primary current sense resistor 203 based on a comparison of the voltage which is developed across the secondary current sense resistor 209 and the calibration resistor 213. These voltages may be indicative of the secondary current sense resistor 209 and the calibration resistor 213, respectively. If they are the same, this may indicate that there has not been any aging drift. The opposite may be true if the voltages are different. Any difference in these voltages may be used by the compensation circuit 219 to generate a compensation signal 221 which may be used to compensate for the aging drift in the secondary current sense resistor 209 which, in turn, may be indicative of comparable aging drift in the primary current sense resistor 203. The amount of aging drift in the primary current sense resistor 203 may be the same as the aging drift in the secondary current sense resistor 209.

Figure 3:
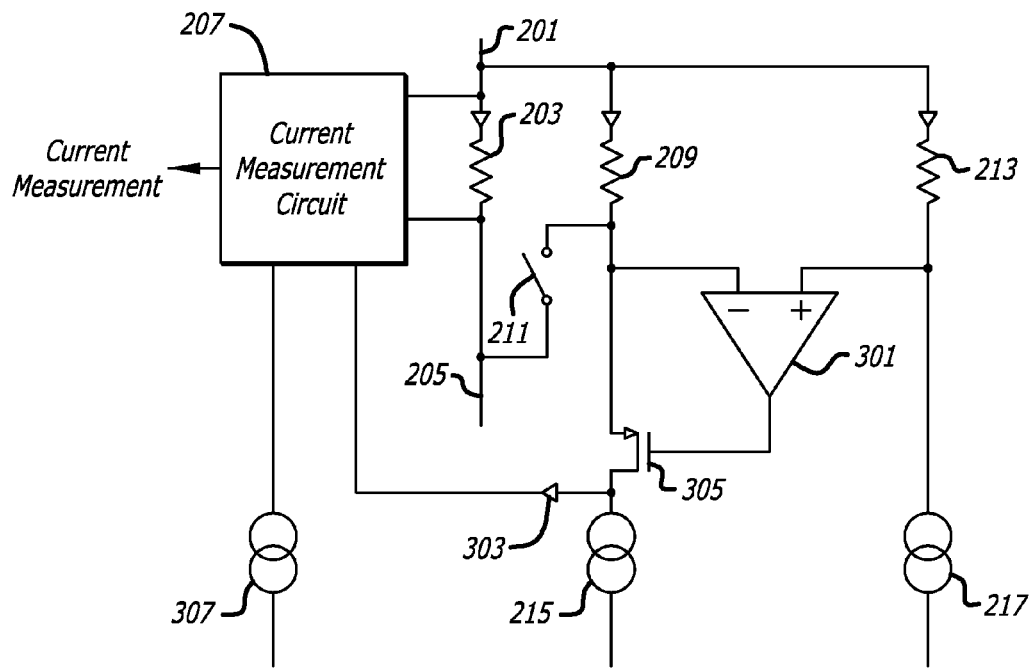
FIG. 3 illustrates the circuit in FIG. 2 with an example of a compensation circuit that provides compensation current that substantially corrects for the aging drift.

FIG. 3 illustrates the circuit in FIG. 2 with an example of a compensation circuit that provides compensation current that substantially corrects for the aging drift. As illustrated in FIG. 3, the compensation circuit may include an operational amplifier 301 and a variable resistance device 305 (e.g., a MOSFET).

During the testing and compensation mode, the voltage across the secondary current sense resistor 209 may be subtracted from the voltage across the calibration resistor 213 by the operational amplifier 301. The difference may be used to drive the variable resistance device 305 so as to compensate for these differences, thereby causing the voltages to equalize. Variations in the current needed to compensate for the current measurement may be provided to the current measurement circuit 207 which, in turn, may be configured to provide compensation for the error caused by the corresponding aging drift in the primary current sense resistor 203. A compensation signal 303 provides a compensation current that represents the amount of current that the secondary current sense resistor 209 conducts that is different than the calibration resistor 213. The amount may depend on whether the resistance of the secondary current sense resistor 209 has increased or decreased as contrasted to the calibration resistor due to drift. The direction of the compensation current depends on whether the secondary current sense resistor drifts upwards or downwards.

The current measurement circuit 207 may include a sample and hold circuit. This circuit may be configured to hold the feedback signal provided by the variable resistance device 305 during the testing and compensation phase so that it remains available during the normal operation of this circuit, i.e., when switch 211 is closed and the compensation circuit is no longer operational.

An additional constant current source circuit 307 may be configured to provide a scaling current to the current measurement circuit 207. The current may be substantially proportional to the currents of current sources 215 and 217. Since the compensation current itself may be proportional to the currents of current sources 215 and 217, the current measurement circuit may divide the compensation signal by the scaling current. This quotient may represent the relative error in the current measurement caused by the drift of the secondary sense resistor 209 relative to the calibration resistor 213. If the voltage across the primary sense resistor 203 is multiplied by this drift quotient plus 1, and the working proposition holds that primary sense resistor and secondary sense resistor have drifted substantially alike, the result may be substantially proportional to the current passing from node 201 to node 205 multiplied by the calibration resistor 213, and the resistor drift is substantially compensated.

The forming of this drift quotient by division and the multiplication operation may be implemented by known analog circuits similar to the AD734 device manufactured by Analog Devices or in the digital domain after analog-to-digital conversion of the relevant signals. The magnitude of the currents of current sources 307, 215, and 217 may not need to be precisely stabilized, as long as they just keep their designed ratio constant during the brief time interval of the testing and compensation mode.

It is known in the art to provide suitable currents with a designed ratio by using current mirrors. It may be advantageous not to need any precisely stabilized or trimmed current sources. However, if a stable voltage such as from a bandgap reference is available, the current of current sources 215 and 217 may be generated by applying the stable voltage to a first resistor, and converting the compensation current to a compensation voltage by a second resistor that matches and tracks the first resistor. In this case, the drift quotient can be formed without a divider by proper scaling of the ratio of the first and second resistors and by assuming the stable voltage is known and constant. The multiplication by the drift quotient plus 1 may still be necessary in this case.

Figure 4:
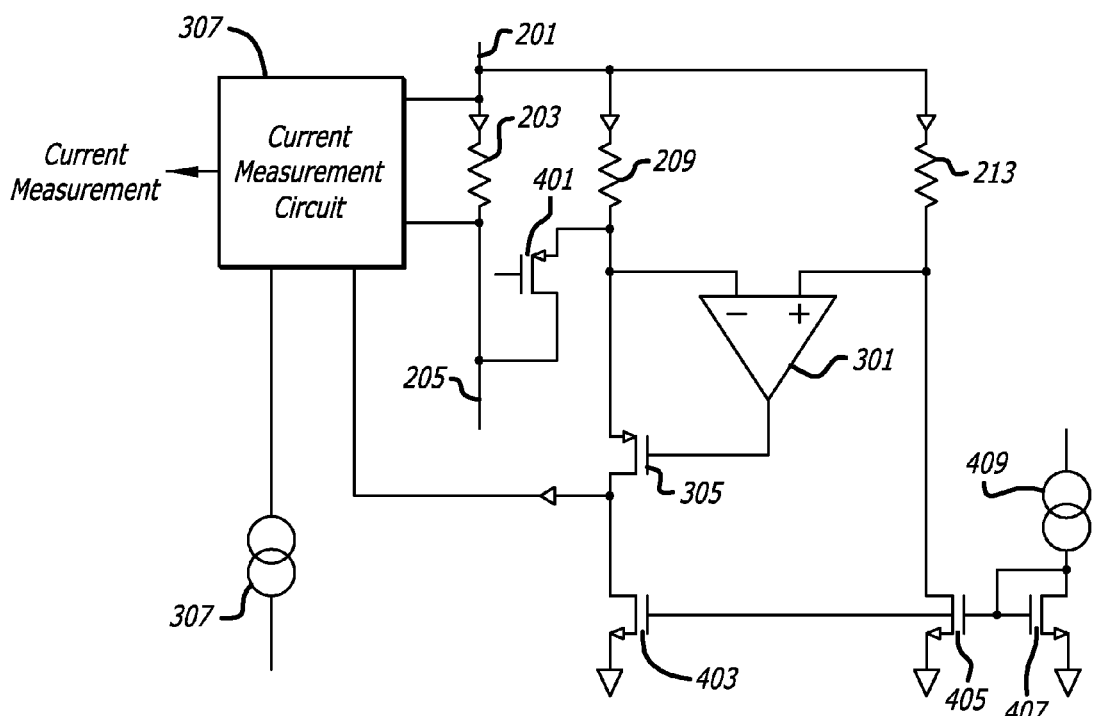
FIG. 4 illustrates the circuit in FIG. 3 with an example of the switch and two current sources.

FIG. 4 illustrates the circuit in FIG. 3 with an example of the switch and two current sources. As illustrated in FIG. 4, the switch 211 in FIG. 3 may be implemented with an electronic switch, e.g., a MOSFET 401. Similarly, the constant current source circuits 215 and 217 may be implemented by a current mirror consisting of MOSFETS 403, 405, 407, and a constant current source circuit 409. Likewise, but not shown in the figure, current source 307 may be implemented by adding another branch to the current mirror. As noted above, the constant current source 409 may not need to be particularly precise, so it may be implemented with any suitable bias current generating building block known in the art, such as the type typically used to generate bias currents for an opamp.

Figure 5:
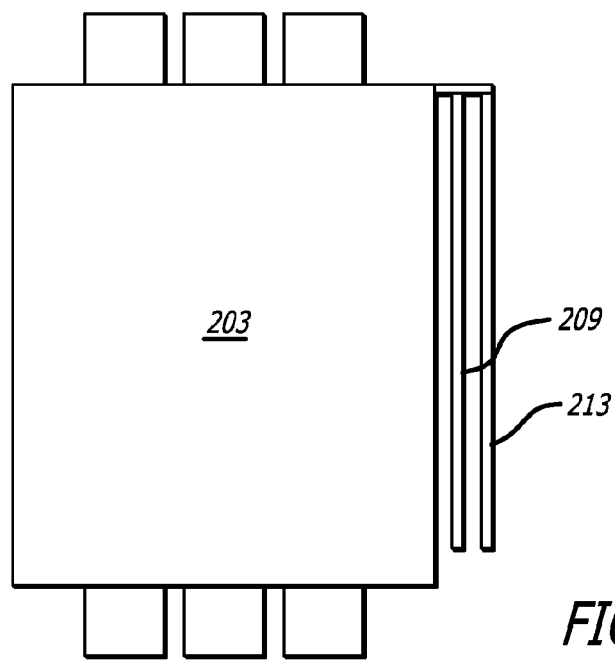
FIG. 5 illustrates an example of a physical layout of the primary current sense resistor, the secondary current sense resistor, and the calibration resistor that are illustrated in FIG. 2.
Figure 6:
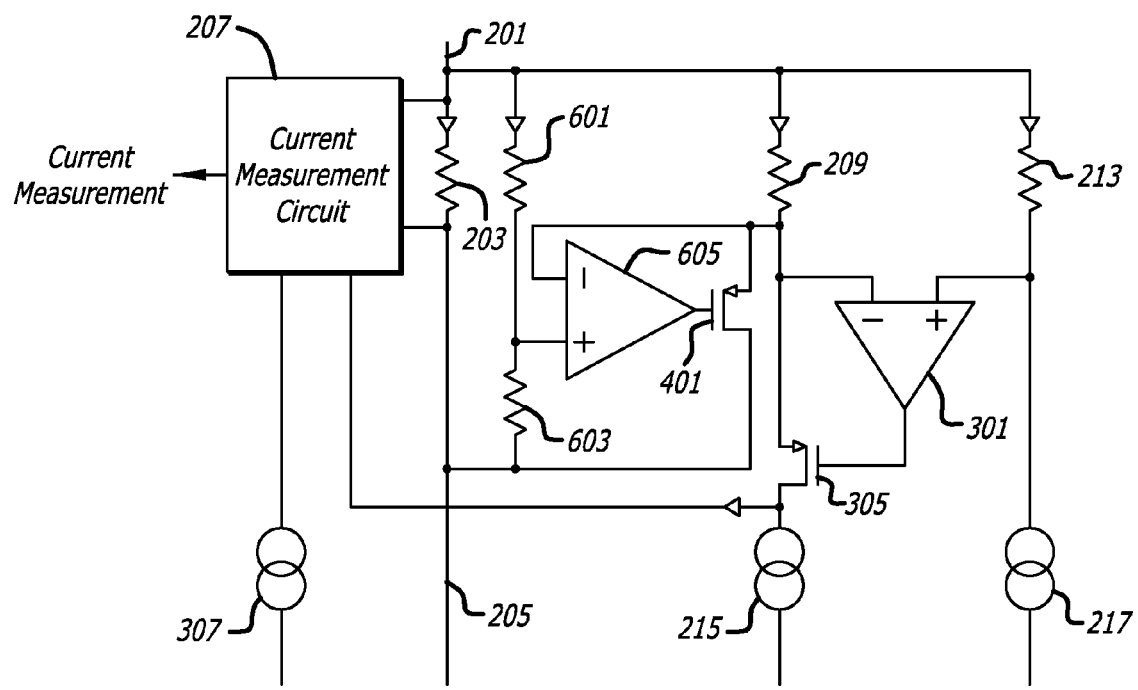
FIG. 6 illustrates the circuit in FIG. 4 with an example of an electronic switch compensation circuit that regulates the on resistor of the electronic switch at a value that tracks the resistor of the primary current sense resistor.

FIG. 5 illustrates an example of a physical layout of the primary current sense resistor, the secondary current sense resistor, and the calibration resistor that are illustrated iN FIG. 2. As illustrated iN FIG. 5, the primary current sense resistor 203 may be implemented with a large volume of resistive material having several connection pads at each end. The secondary current sense resistor 209 and the calibration resistor 213 may be implemented with a much smaller volume of resistive material. The primary current sense resistor 203 and the secondary current sense resistor 209 may be thermally coupled so as to ensure that they are both always at approximately the same temperature. The calibration resistor 213 may or may not be thermally coupled to the primary current sense resistor 203 and/or the secondary sense resistor 209. If the stability of the calibration resistor happens to be adversely affected by elevated temperatures, thermally decoupling it from the primary and secondary current sense resistors may bring the best overall results. When never exposed to the load current, calibration resistor 213 also may be made from a different material having smaller current handling capabilities than the material of resistors 203 and 209, but with higher stability and a lower temperature coefficient. One example for such a high stability material is known in the art as silicon chrome (SiCr) thin film. If this material is employed for the calibration resistor, its thermal coupling or the lack thereof may be irrelevant FIG. 6 illustrates the circuit in FIG. 4 with an example of an electronic switch compensation circuit that regulates the on resistance of the electronic switch 401 to substantially track the resistance of the primary sense resistor 203. The electronic switch compensation circuit may include a feedback circuit that includes a resistor voltage divider network connected between the nodes 201 and 205 and an operational amplifier 605. The resistor voltage divider network may include a resistor 601 connected in series with a resistor 603. This feedback circuit may ensure that the on resistance of the electronic switch 401 substantially tracks the resistance of the primary sense resistor 203, notwithstanding aging drift in the primary current sense resistor 203 and the secondary current sense resistor 209. The ratio of the resistors 601 and 603 may be in any amount, for instance 50/50, but they should be sufficiently high resistive that the current through them can be neglected compared to the current flowing through resistors 203 and 209.

In case of a 50/50 ratio, the resistance of the electronic switch 401 may be proportional to half of the resistance of the primary sense resistor 203 and may maintain the same current density. The length of the secondary sense resistor 209 also can be cut in half, compared to the ideal case of a zero ohm switch. This arrangement may allow the use of electronic switches having substantial "on" resistance. This may be advantageous as the silicon real estate area of a MOSFET used as an electronic switch may shrink proportionally as its allowed "on" resistance increases.

Figure 7:
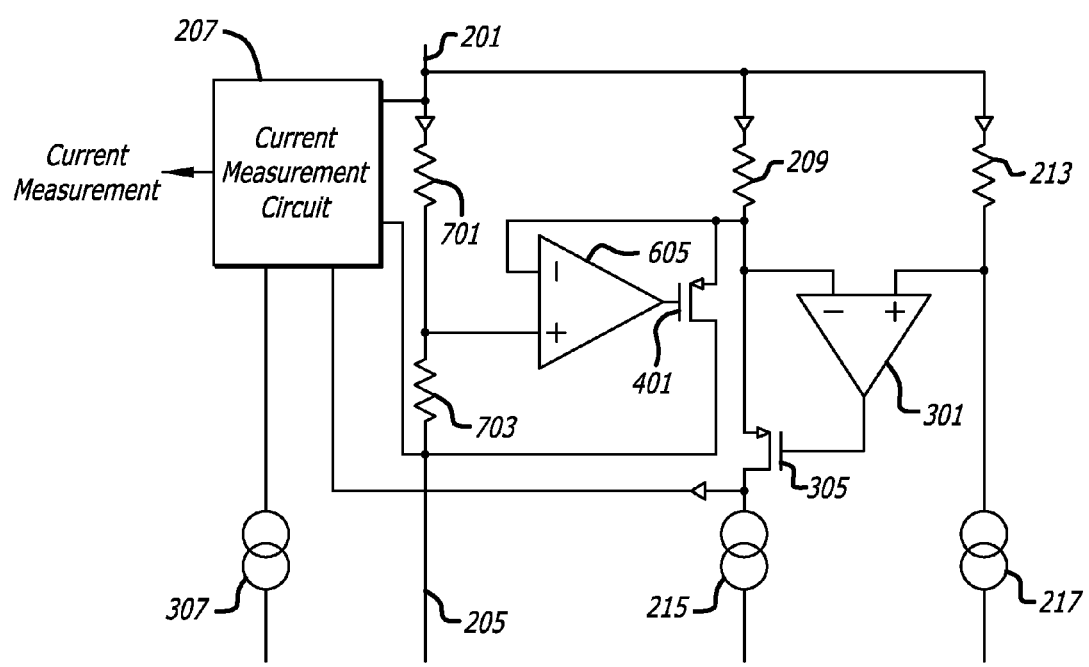
FIG. 7 illustrates the circuit in FIG. 4 with an example of an electronic switch compensation circuit that regulates the on resistance of the electronic switch at a value that tracks the resistance of the primary current sense resistor.

FIG. 7 illustrates the circuit in FIG. 4 with an example of an electronic switch compensation circuit that regulates the on resistance of the electronic switch to substantially track the resistance of the primary sense resistor 203. The circuit illustrated in FIG. 7 may be comparable to the one illustrated in FIG. 6, except that the primary current sense resistor may consist of two resistors 701 and 703 connected in series which may collectively serve as the resistor voltage divider network. The ratio of the resistors 701 and 703 may be in any amount, such as 50/50. resistors 701 and 703 may be implemented by providing a center tap on the resistor 203 as illustrated in FIG. 6.

Figure 8:
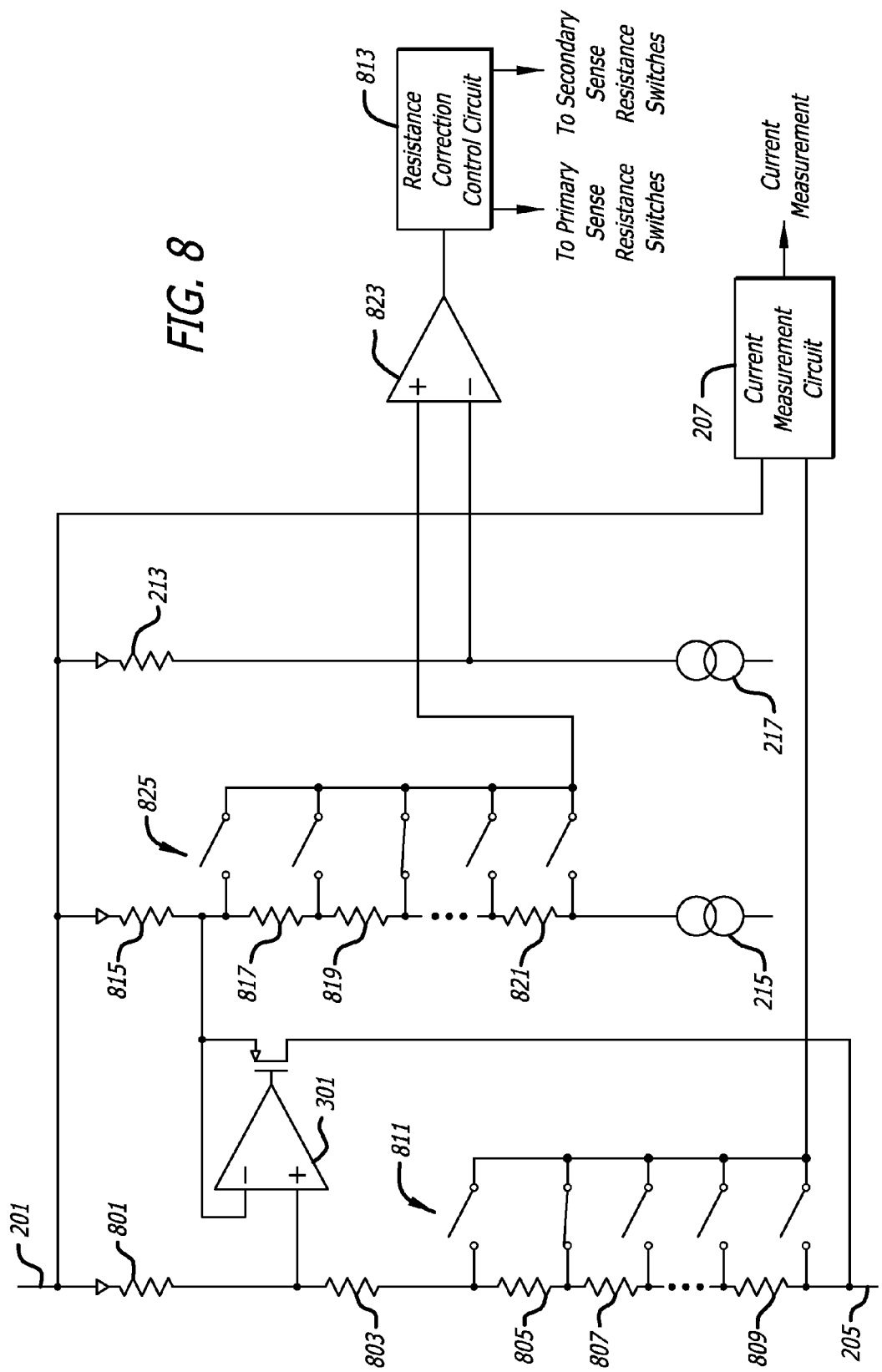
FIG. 8 illustrates the circuit in FIG. 2 with an example of a compensation circuit that changes the resistance of the primary and the secondary current sense resistors to substantially correct for aging drift.

FIG. 8 illustrates the circuit in FIG. 2 with an example of a compensation circuit that changes the resistance of the primary and the secondary current sense resistors to substantially correct for aging drift. As illustrated in FIG. 8, the primary sense resistor may comprise a selected number of resistors in series. This selected number may be selected from a set of series resistors 801, 803, 805, 807, and 809. A switch in an electronic switch network 811 may be controllably closed to effectuate the selection. In a typical implementation, resistors 801 and 803 may be designed to be much larger in resistive value than the resistors 805 to 809. The ratio of the sum of resistors 805 to 809 divided by the sum of resistors 801 and 803 may be chosen such that it is somewhat larger than the relative resistance drift to be compensated.

Although five resistors are illustrated in FIG. 8 as constituting the set of resistors from which the primary current sense resistor is selected, a different number may be used, such as a larger or smaller number. These resistors may be implemented by providing taps on a single body of resistive material. The switch in the electronic switch network 811 that is controllably closed may be selected by a resistance correction control circuit 813 that is configured to select the switch that will cause the primary sense resistor to return as closely as possible to its original value when it was originally manufactured, thus compensating for aging drift in the resistance of the primary current sense resistor.

For example, when the circuit in FIG. 8 is first constructed, the resistance correction control circuit 813 may be configured to close the second topmost switch in the electronic switch network 811, thus causing the primary current sense resistor to be the resistors 801, 803, and 805, but not the resistors 807 to 809. If a correction is later needed, the resistance correction control circuit 813 may be configured to close a different one of the electronic switches in the electronic switch network 811, either to add one of the resistors in the ladder (if the drift caused the resistance of the primary sense resistor to decrease) or to remove one of the resistors in the ladder network (if the drift cause the resistance of the primary sense resistor to increase).

The secondary current sense resistor may be comprised of a selected number of resistors in series selected from a comparable set of series resistors 815, 817, 819, and 821 and controlled by a comparable electronic switch network 825, in much the same manner as the primary current sense resistor and the electronic switch network 811. Again, the number of resistors in the resistor network may be larger or smaller. The resistance correction control circuit 813 may similarly be configured to control the electronic switch network 825 in the same fashion as the electronic switch network 811, namely to remove one or more of the resistors from the secondary current sense resistor when the drift causes an increase in its resistance, but to add one or more additional resistors in the secondary current sense resistor when the drift causes a decrease in its resistance.

Like the operational amplifier 301 in FIG. 3, an operational amplifier 823 may be configured to generate an error signal indicating the deviation between the secondary current sense resistor and the calibration resistor 213 that may be caused by aging drift in the secondary current sense resistor. In turn, this signal may be used to drive a resistance correction control circuit 813 to cause the electronic switch network 825 to adjust the value of the secondary current sense resistor until it again most closely matches the calibration resistor 213. The resistance correction control circuit 813 may similarly be configured to make corresponding adjustments to the electronic switch network 811 so as to cause corresponding adjustments in the primary current sense resistor. A particular advantage of this arrangement may be the avoidance of any multiplication or division operation in the current measurement circuit which may have been needed with the previously disclosed circuits.

Figure 9:
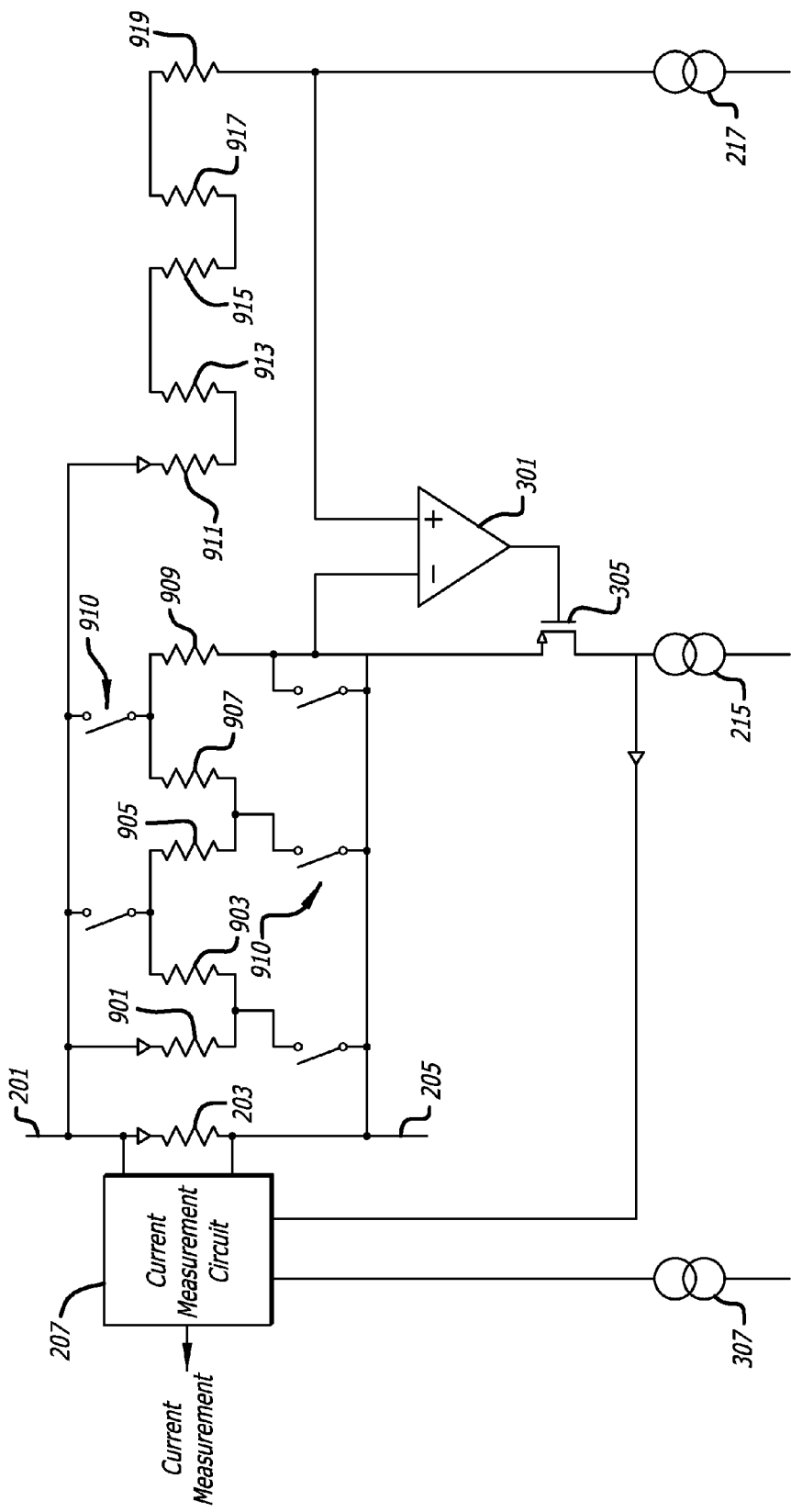
FIG. 9 illustrates the circuit in FIG. 2, except that the secondary current sense resistor comprises a set of resistors that are connected in parallel when the compensation circuit is not comparing the calibration resistor with the secondary current sense resistor and in series when it is.

FIG. 9 illustrates the circuit in FIG. 2, except that the secondary current sense resistor comprises a set of resistors that are connected in parallel when the compensation circuit is not comparing the calibration resistor with the secondary current sense resistor and in series when it is. As illustrated in FIG. 9, the secondary current sense resistor may consist of a set of resistors 901, 903, 905, 907, and 909. A different number may be used, such as a larger or smaller number. Furthermore, the calibration resistor may be made of a set of equal resistors 911, 913, 915, 917, 919 connected in series.

During normal operation of the circuit illustrated in FIG. 9, the resistors which comprise the secondary current sense resistor may be configured to all be in parallel with the primary current sense resistor 203. An electronic switch network 910 may be configured to facilitate this parallel connection by closing all of its switches during this normal mode of operation. The switch resistance tracking circuits illustrated in FIGS. 6 and 7 may be added.

During the testing and calibration mode, on the other hand, the resistors which comprise the secondary current sense resistor may all be connected in series. This may be facilitated, for example, by all of the switches which comprise the electronic switch network 910 being opened.

The net effect of connecting all of the resistors which comprise the secondary current sense resistor in parallel with the primary current sense resistor during normal operation, but in series during a testing and calibration phase, may be to multiply the effect of aging drift in the secondary current sense resistors, thereby enhancing the sensitivity of the circuit.

The calibration resistor may be the same as the secondary current sense resistor when its individual resistors are connected in series, i.e., during the testing and calibration mode. The calibration resistor may be a single resistor or, as illustrated in FIG. 9, a set of resistors 911, 913, 915, 917, and 919 connected in series. Again, the number of series resistors that may be used may be more or less. They may or may not be the same as the number of resistors used for the secondary current sense resistor.

Figure 10:
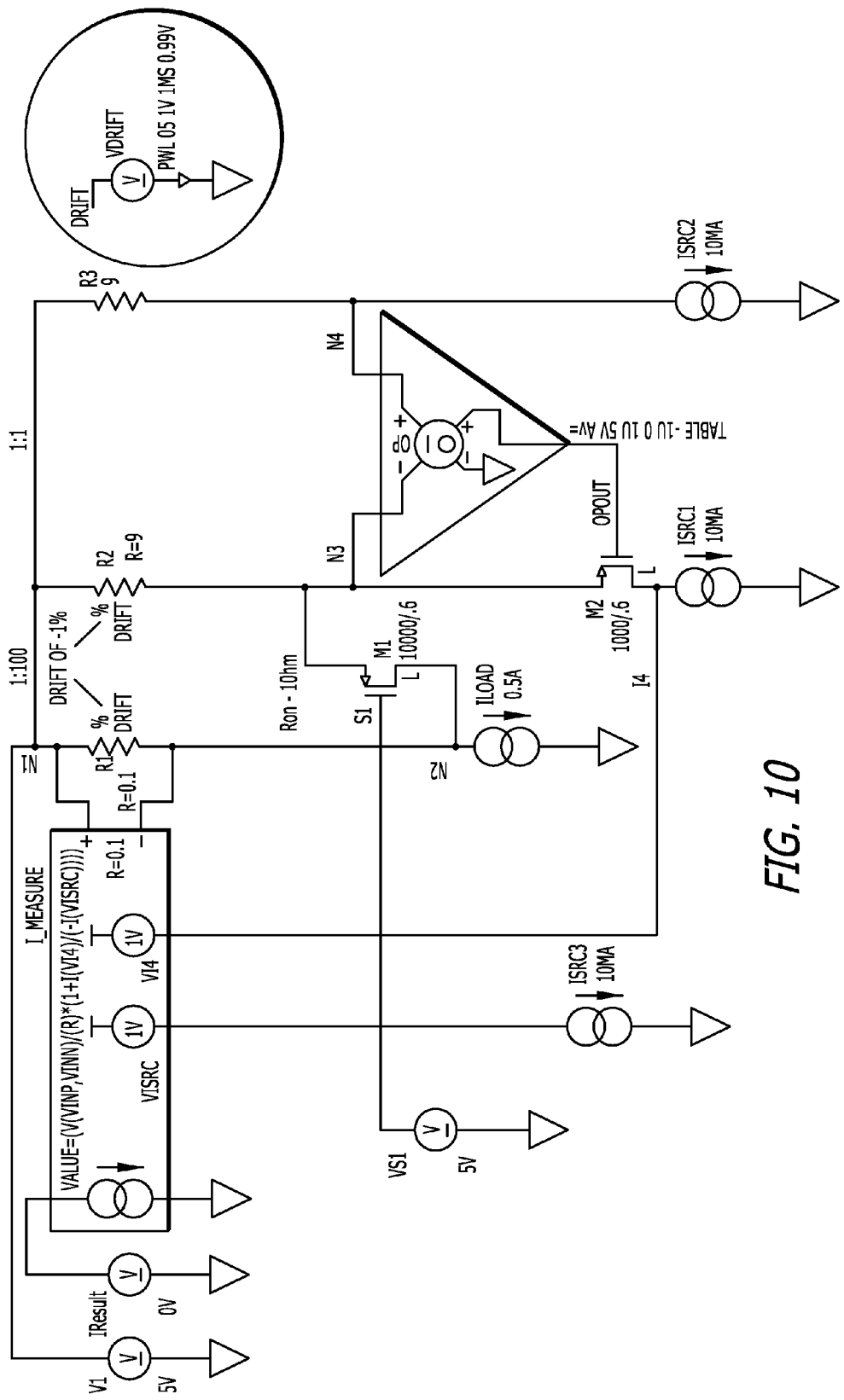
FIG. 10 illustrates how the current sense resistor circuit of FIG. 4 may be implemented in a circuit simulator, such as SPICE, and shows how the components may be dimensioned.

FIG. 10 illustrates how the current sense resistor circuit of FIG. 4 may be implemented in a circuit simulator, such as SPICE, and shows how the components may be dimensioned. R1 may be 0.1 Ohms and function as the primary current sense resistor. R2 may be 9 Ohms and functions as the secondary sense resistor, and MOSFET M1 functions a the electronic switch 401. The gate voltage of M1 was chosen such that it exhibits a "on" resistance Ron=1 Ohm. Hence, the series resistor of R2 and Ron is 10 Ohms. This reflects conditions as if the electronic switch compensation circuits of FIGS. 6 and 7 were present. The components 601, 603, 605 of FIG. 6 could be added to the SPICE simulation, but this was not done for clarity. If added, resistor 601 may be chosen to be 9 kiloohms, and resistor 603 may be chosen to be 1 kiloohms, to have the same ratio as R2 and Ron. Since the 10 Ohms series resistance of R2 and Ron is 100 times larger than the 0.1 Ohm resistance of R1, to achieve the same current density in R2 as in R1 in normal operation, the cross sectional area of R2's resistive body may be $\frac{1}{100}$ of the cross sectional area of R1's resistive body. Calibration resistor R3 here was chosen to be the same value as R2. In cases where calibration resistor R3 is to be made from a different material exhibiting higher stability than the material used for R1 and R2, which typically is of much higher sheet resistance, but can carry much less current density, the value of R3 can be multiplied by any factor and the current of ISRC2 divided by the same factor. For instance, if R3 is chosen to be 9 Kiloohms, ISRC may deliver 10 microamperes. The block I_MEASURE implements the current measurement circuit 307 known from FIG. 4. This block may receive the voltage across the primary sense resistor R1 as the expression V(VINP,VINN), the compensation signal, current I4, and the scaling current from source ISRC3. SPICE dictates the currents to be received by voltage sources VISRC and VI4. The formula given in the measurement block shows the division for the drift quotient, and the multiplication of the sense voltage with the drift quotient plus 1. The minus sign in the drift quotient comes from the orientation of receiving voltage source VI4. The R in the formula is an arbitrary scaling factor allowing this behavioral model to produce an output current proportional to ILOAD which again is received by a voltage source named IResult. The assumed 1% drift of the resistance of R1 and R2 is simulated by proving a time variable voltage source VDRIFT, and its output voltage DRIFT is used as the control voltage of the voltage controlled resistors R1 and R2.

Figure 11:
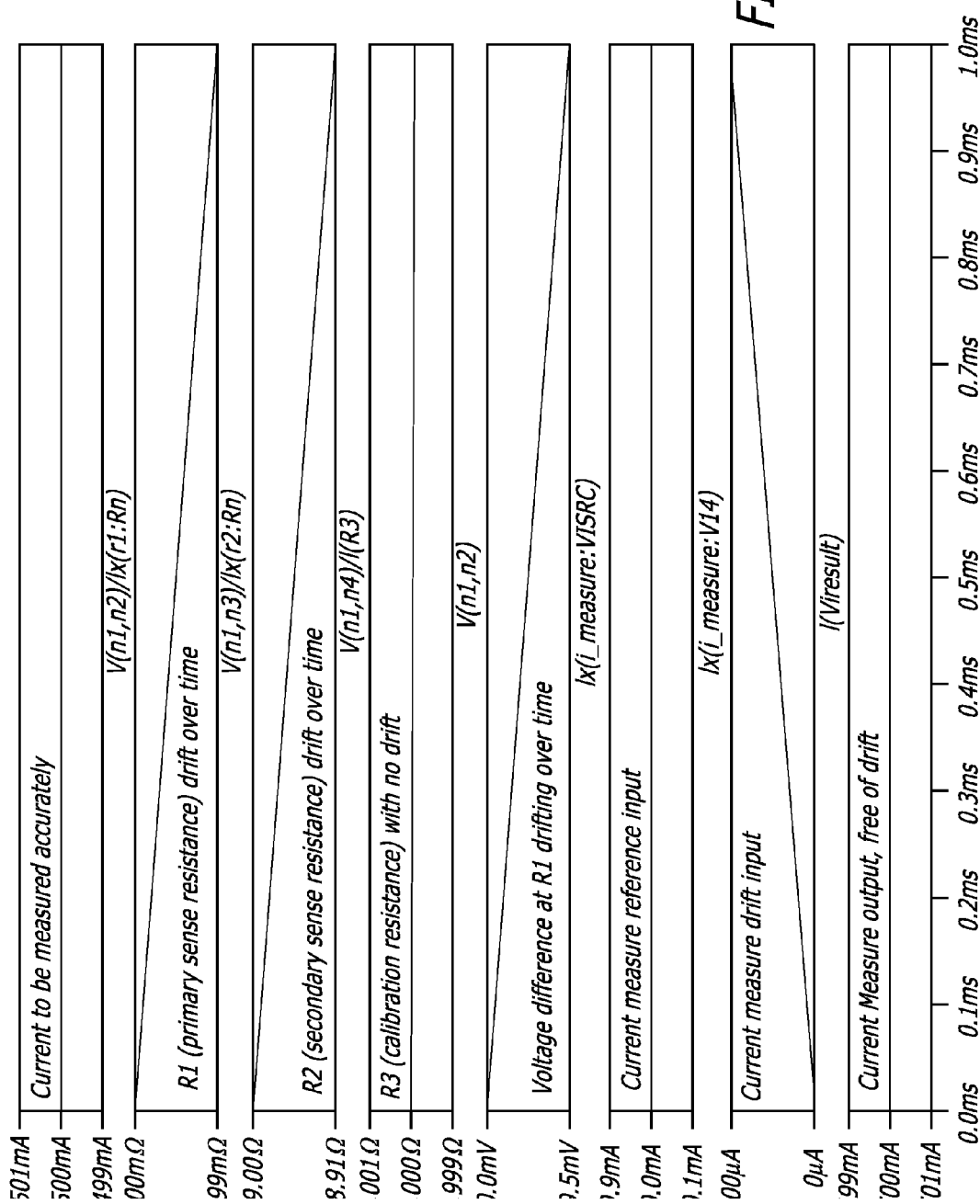
FIG. 11 illustrates changes over time in resistors, currents, and a voltage in the circuit illustrated in FIG. 10.

FIG. 11 illustrates changes over time in resistances, currents, and a voltage in the circuit illustrated in FIG. 10. The time scale in the simulation reads milliseconds, while such a resistor drift in the real world may take a year or even more, depending on the type resistive material and how it is deposited and/or formed into a resistor. In the bottom trace it is seen the current measurement output is completely free of drift, hence, the drift of the resistors R1 and R2 is perfectly compensated.

The current measurement circuits, the compensation circuits, and the resistance correction control circuits that have been discussed and illustrated may be implemented with electronic components configured to perform the respective functions of these circuits as described herein.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

For example, the calibration resistor 213 need not be connected to the node 201, but may be wholly isolated from this node. Although often illustrated as a single resistor, the primary current sense resistor, the secondary current sense resistor, and the calibration resistor may, in fact, comprise two or more resistors.

When multiple resistors are used for the primary current sense resistor and/or the secondary current sense resistor, calibration tests may be performed separately on each individual resistor.

Other means of compensation may be provided in addition or instead. For example, the current measurement circuit may comprise a Coulomb counter whose reference voltages, reference currents or oscillator frequency is changed by the drift compensation signal.

The forming of the drift compensation signal may be done in a step-by-step process, not just as continuous process as shown in the examples. The step-by-step process may include sample-and-hold stages for any voltage or current that contributes to the drift compensation signal. The same current source, or a subset of current sources, may be shared between the steps.

The electronic switch and its resistance compensation circuit may be connected at any suitable pair of nodes in the primary and secondary current sense resistor strings. For instance, in the circuit of FIG. 8, the plus input of the opamp 301 may be provided with a resistor voltage divider network 601, 603 connected between the nodes 201 and 205 as in FIG. 6, and the electronic switch may be connected to any node of the resistors 817, 819, 821, as long as the relevant voltage drops and current densities are designed according to the teachings herein.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases in a claim mean that the claim is not intended to and should not be interpreted to be limited to any of the corresponding structures, materials, or acts or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

The invention claimed is:

1. A current sense resistor circuit comprising
a primary current sense resistor that drifts with age;
a secondary current sense resistor that drifts with age in substantial unison with the primary current sense resistor;
a calibration resistor that does not drift with age in substantial unison with the primary current sense resistor; and
a compensation circuit configured to compensate for aging drift in the resistance of the primary current sense resistor based on a comparison of the calibration resistor with the secondary current sense resistor.

2. The current sense resistor circuit of claim 1 wherein the secondary current sense resistor is in parallel with the primary current sense resistor, except when the compensation circuit is comparing the calibration resistor with the secondary current sense resistor.

3. The current sense resistor circuit of claim 2 wherein the primary and the secondary sense resistors have substantially the same current densities.

4. The current sense resistor circuit of claim 3 wherein the resistance of the secondary current sense resistor is between 1 and 1,000,000 times the resistance of the primary sense resistor.

5. The current sense resistor circuit of claim 2 wherein the secondary current sense resistor is configured such that it is always at substantially the same temperature as the primary sense resistor.

6. The current sense resistor circuit of claim 2 wherein the secondary sense resistor and the calibration resistor are substantially the same value.

7. The current sense resistor circuit of claim 6 wherein the compensation provided by the compensation circuit is a function of the difference between the resistances of the calibration resistor and the secondary current sense resistor.

8. The current sense resistor circuit of claim 2 further comprising an electronic switch configured to controllably connect the secondary sense resistor in parallel with the primary sense resistor.

9. The current sense resistor circuit of claim 8 further comprising an electronic switch compensation circuit configured such that the on resistance of the electronic switch tracks the resistance of the primary current sense resistor.

10. The current sense resistor circuit of claim 9 wherein the electronic switch compensation circuit includes a feedback circuit that includes a resistor voltage divider network.

11. The current sense resistor circuit of claim 10 wherein the primary sense resistor functions as the resistor voltage divider network.

12. The current sense resistor circuit of claim 2 further comprising a current source circuit configured to deliver a substantially constant current to the secondary current sense resistor when the compensation circuit compares the calibration resistor to the secondary current sense resistor.

13. The current sense resistor circuit of claim 2 further comprising a current source circuit configured to deliver a substantially constant current to the calibration resistor when the compensation circuit compares the calibration resistor to the secondary current sense resistor.

14. The current sense resistor circuit of claim 2 wherein the secondary sense resistor includes a plurality of resistors that are:
    connected in parallel when the compensation circuit is not comparing the calibration resistor with the secondary current sense resistor; and
    connected in series when the compensation circuit is comparing the calibration resistor with the secondary current sense resistor.

15. The current sense resistor circuit of claim 14 wherein the resistance of the calibration resistor is substantially equal to the resistance of the secondary sense resistor when the plurality of resistors are connected in series.

16. The current sense resistor circuit of claim 1 wherein the compensation circuit is configured to compensate for aging drift in the resistance of the primary current sense resistor by providing a compensation current that substantially corrects for the aging drift.

17. The current sense resistor circuit of claim 1 wherein the compensation circuit is configured to compensate for aging drift in the resistance of the primary current sense resistor by changing the resistance of the primary current sense resistor to substantially correct for the aging drift.

18. The current sense resistor circuit of claim 17 wherein:
    the primary current sense resistor includes a set of resistors connected in series having a selectable voltage sensing tap point; and
    the compensation circuit is configured to change the resistance of the primary current sense resistor by changing the selectable voltage sensing tap point.

19. The current sense resistor circuit of claim 17 wherein the compensation circuit is configured to compensate for aging drift in the resistance of the primary current sense resistor by changing the resistance of the secondary current sense resistor to match the change in the resistance of the primary current sense resistor.

20. The current sense resistor circuit of claim 19 wherein:
    the secondary current sense resistor includes a set of resistors connected in series having a selectable voltage sensing tap point; and
    the compensation circuit is configured to change the resistance of the secondary current sense resistor by changing the selectable voltage sensing tap point.

21. A current sense resistor circuit comprising
    a primary current sense resistor that drifts with age;
    a secondary current sense resistor;
    a calibration resistor; and
    a compensation circuit configured to compensate for aging drift in the resistance of the primary current sense resistor based on a comparison of the calibration resistor with the secondary current sense resistor.

22. The current sense resistor circuit of claim 21 wherein the secondary current sense resistor is in parallel with the primary current sense resistor, except when the compensation circuit is comparing the calibration resistor with the secondary current sense resistor.

* * * * *